US010923392B2

(12) United States Patent
Chae et al.

(10) Patent No.: US 10,923,392 B2
(45) Date of Patent: Feb. 16, 2021

(54) INTERCONNECT STRUCTURE AND METHOD OF FORMING THE SAME

(71) Applicant: Tokyo Electron Limited, Tokyo (JP)

(72) Inventors: Soo Doo Chae, Guilderland, NY (US);
Jeffrey Smith, Clifton Park, NY (US);
Gerrit J. Leusink, Rexford, NY (US);
Robert D. Clark, Livermore, NY (US);
Kai-Hung Yu, Watervliet, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/562,207

(22) Filed: Sep. 5, 2019

(65) Prior Publication Data

US 2020/0006129 A1  Jan. 2, 2020

Related U.S. Application Data

(62) Division of application No. 15/875,442, filed on Jan. 19, 2018, now Pat. No. 10,541,174.
(Continued)

(51) Int. Cl.
*H01L 21/00* (2006.01)
*H01L 21/768* (2006.01)
(Continued)

(52) U.S. Cl.
CPC .. *H01L 21/76835* (2013.01); *H01L 21/76808* (2013.01); *H01L 21/76811* (2013.01); *H01L 21/76813* (2013.01); *H01L 21/76816* (2013.01); *H01L 21/76832* (2013.01); *H01L 21/76834* (2013.01); *H01L 21/76877* (2013.01); *H01L 23/522* (2013.01); *H01L 23/53228* (2013.01); *H01L 23/53257* (2013.01);
(Continued)

(58) Field of Classification Search
None
See application file for complete search history.

(56) References Cited

U.S. PATENT DOCUMENTS 8,796,853 B2    8/2014 Yang
2004/0094841 A1    5/2004 Matsuzaki
(Continued)

FOREIGN PATENT DOCUMENTS

KR    10-0870271 B1    11/2008
WO    WO 2016/196937 A1    12/2016

OTHER PUBLICATIONS

International Search Report and Written Opinion dated May 4, 2018 in PCT/US2018/014373.

*Primary Examiner* — Reema Patel
(74) *Attorney, Agent, or Firm* — Oblon, McClelland, Maier & Neustadt, L.L.P.

(57) ABSTRACT

A semiconductor device is provided. The semiconductor device can have a substrate including dielectric material. A plurality of narrow interconnect openings can be formed within said dielectric material. In addition, a plurality of wide interconnect openings can be formed within said dielectric material. The semiconductor device can include a first metal filling the narrow interconnect openings to form an interconnect structure and conformally covering a surface of the wide interconnect openings formed in the dielectric material, and a second metal formed over the first metal and encapsulated by the first metal to form another interconnect structure within the wide interconnect openings.

11 Claims, 18 Drawing Sheets

Related U.S. Application Data

(60) Provisional application No. 62/448,788, filed on Jan. 20, 2017.

(51) Int. Cl.
*H01L 23/522* (2006.01)
*H01L 23/532* (2006.01)
*H01L 21/285* (2006.01)

(52) U.S. Cl.
CPC .. *H01L 21/28562* (2013.01); *H01L 21/76883* (2013.01); *H01L 2221/1031* (2013.01)

(56) References Cited

U.S. PATENT DOCUMENTS

| | | |
|---|---|---|
| 2004/0113235 A1 | 6/2004 | Coolbaugh et al. |
| 2004/0134769 A1 | 7/2004 | Wang |
| 2006/0094236 A1* | 5/2006 | Elkins .................. H01L 21/288 438/652 |
| 2006/0097397 A1* | 5/2006 | Russell ............ H01L 21/76847 257/762 |
| 2006/0134909 A1* | 6/2006 | Nagase ............ H01L 21/31138 438/637 |
| 2007/0059925 A1* | 3/2007 | Choi ................. H01L 21/76843 438/640 |
| 2010/0327445 A1* | 12/2010 | Filippi .............. H01L 21/76802 257/751 |
| 2013/0270703 A1* | 10/2013 | Zierath ............ H01L 21/76877 257/751 |
| 2015/0187699 A1 | 7/2015 | Baek |
| 2015/0206792 A1 | 7/2015 | Hsieh et al. |
| 2016/0225665 A1 | 8/2016 | Yoo et al. |

\* cited by examiner

INTERCONNECT STRUCTURE AND METHOD OF FORMING THE SAME

CROSS REFERENCE TO RELATED APPLICATIONS

This application is a Divisional Application of U.S. Non-Provisional application Ser. No. 15/875,442, filed Jan. 19, 2018, which claims the benefit of U.S. Provisional Application No. 62/448,788, filed Jan. 20, 2017, the entire contents of which is incorporated herein by reference.

FIELD OF THE INVENTION

The invention relates to semiconductor micro fabrication including systems and processes for patterning, deposition, and removal of materials on a given substrate or wafer.

BACKGROUND

Semiconductor devices are widely used in various electronic equipment, such as smart phones, laptops, digital cameras, and other equipment. In general, a typical semiconductor device includes a substrate having active devices such as transistors, capacitors, inductors and other components. These active devices are initially isolated from each other, and interconnect structures are subsequently formed over the active devices to create functional circuits. Such interconnect structures may include lateral interconnections, such as metal lines (wirings), and vertical interconnections, such as conductive vias or contact plugs.

There is an ever increasing demand for smaller and faster semiconductor devices which are simultaneously able to support a greater number of increasingly complex and sophisticated functions. This scaling down process generally provides benefits by increasing production efficiency and lowering associated costs. Nevertheless, such scaling down has also increased the complexity of processing and manufacturing of the semiconductor devices. As dimensions of semiconductor devices scale to smaller sub-micron sizes in advanced technology nodes, it becomes an increasing challenge to reduce the interconnect structure resistance while decreasing the interconnect structure size. Improved structures and methods for manufacturing same are needed.

SUMMARY

In one aspect, a semiconductor device can include an interconnect opening formed within a dielectric material. The interconnect opening disclosed herein can have a trench opening, a via opening, or a dual damascene opening. A first metal can conformally cover a surface of the interconnect opening, and can either be in direct contact with the dielectric material, or in contact with a pre-deposited thin liner or barrier material. The semiconductor device can have a second metal being filled in the interconnect opening as well. The second metal can be formed over the first metal and encapsulated by the first metal to form an interconnect structure within the interconnect opening. In some embodiments, the first metal can be conformally deposited in the interconnect opening with a high aspect ratio and acts as a barrier/liner to the second metal. Aspect ratio herein means the ratio of a width to a height of an trench opening, or the ratio of a width to a height of a via opening in the interconnect opening. In an embodiment, the first metal can be ruthenium (Ru) that can provide a conformal coverage in a trench opening or a via opening with a high aspect ratio. The second metal can have a lower resistivity than the first metal, but would not be a suitable material for direct deposition alone due to a number of possible reasons such as metal diffusion into the dielectric or electromigration (EM) concerns. In these cases, relatively thick liners and/or barrier films, for example several nanometers thick, would be required for the second metal alone to be used. Incorporation thick liners and/or barriers to the metal stack often involves the fact that a resistivity of such suitable liner and/or barrier materials are over one order of magnitude greater than a resistivity of the bulk metal to be used. In some cases the metal selection of the first and second metal fills can be done such that the first metal does not require any barrier to the surrounding dielectric and has near-infinite lifetime such as Ru; and that the first metal itself, such as Ru, can act as a barrier material to the second metal which would normally have significant diffusion into the surrounding dielectric if the second metal is used alone. In an embodiment, the second metal can be copper (Cu), for example. Hence, instead of requiring the use of high resistivity barrier or liner films, a lower resistivity metal such as Ru could be used as a barrier layer that actively is part of the interconnect structure. In the disclosure herein, metal filled in the trench opening becomes a metal line of the interconnect structure to provide a lateral interconnection, and metal filled in the via opening becomes a conductive via to provide vertical interconnection in the semiconductor device. The semiconductor device can further include a plurality of conductive layers formed within the dielectric material, and the conductive layer can be at a bottom of the interconnect structure and can be in direct contact with the interconnect structure. In an embodiment, the conductive layer can be a metallization layer in backend of line (BEOL) processing, such as Ru, for example. In another embodiment, the conductive layer can a conductive layer formed on a gate electrode or can be a conductive layer formed on a doped substrate region (e.g., a drain or source region). In various embodiments, the conductive layer can also be any conductive component in the semiconductor device. The semiconductor device can further have a top surface of the interconnect structure being lower than a top surface of the dielectric material.

In another aspect, a method for manufacturing a semiconductor device includes forming a dielectric material, and forming a plurality of interconnect openings within the dielectric material. The interconnect opening can include a trench opening, a via opening, or a dual damascene opening. The dielectric material can include a plurality of conductive layers within the dielectric material where the conductive layer is formed at a bottom of the interconnect opening and is in direct contact with the interconnect opening. The method can also include depositing a first metal to fill the interconnect opening, depositing a second metal over the first metal to fill the interconnect opening and recessing the second metal. In some embodiments, the first metal can have a property to provide a conformal coverage in an opening with high aspect ratio, such as Ru, for example, and the second metal can have a lower resistivity than the first metal, such as Cu, for example. The first metal can have a low metal diffusion and can be deposited without introducing a pre-deposited barrier/liner between the first metal and the surrounding dielectric material. The first metal can also act as a barrier/liner to the second metal. The method can further include depositing a third metal over the first metal and the second metal to fill the interconnect opening completely in order to form a metal cap over the interconnect structure to serve as a metalized low-resistivity barrier material to the second metal. This cap would serve the function of a metal barrier to prevent diffusion from the second metal up to the dielectric that can be subsequently deposited above the interconnect structure that will provide insulation between adjacent upper and lower metal layers, and can additionally provide better EM control for the second metal. In an embodiment, the third metal can be the same as the first metal, such as Ru, for example. The second metal can be encapsulated by the first metal and the third metal after the formation of the third metal. The method can include planarizing the semiconductor device where a top surface of the dielectric material is level with a top surface of the metal filled in the interconnect opening. The method can further include recessing the metal filled in interconnect opening where a top surface of the metal filled in the interconnect opening can be lower than a top surface of the dielectric material.

In another aspect, a semiconductor device can have a plurality of interconnect openings formed within a dielectric material. The interconnect opening can have a trench opening, a via opening, or a dual damascene opening. A first metal can conformally cover a surface of the interconnect opening, and can be in direct contact with the dielectric material. A second metal having a lower resistivity than the first metal can be formed over the first metal to form an interconnect structure within the interconnect opening. In the present disclosure, a top surface of the second metal can be level with a top surface of the first metal. The semiconductor device can also include a plurality of conductive layers formed within the dielectric material beneath the interconnect structure and at least one of the conductive layers can be in direct contact with the interconnect structure. In the disclosure herein, a top surface of the interconnect structure can be lower than a top surface of the dielectric material.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
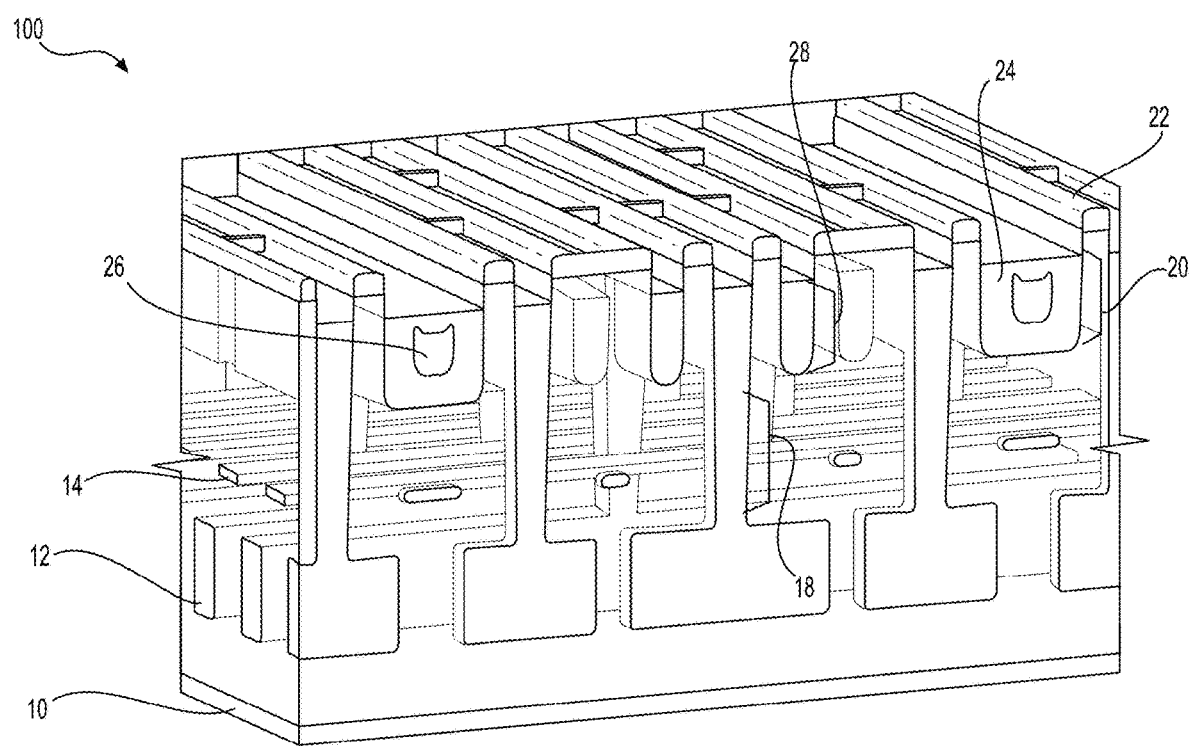
FIG. 1A illustrates a schematically perspective view of an exemplary semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The invention relates generally to fabrication of interconnect structures within integrated circuits, and more particularly, to using a deposition, recessing, deposition process to form an interconnect structure including multiple metals. The interconnect structure disclosed herein can have low resistance and good reliability. Techniques herein include structures and methods for fabrication of semiconductor devices. Such techniques can be applied, for example to back-end-of-line (BEOL) metallization steps for making interconnect structures including a metal line and/or a conductive via. One embodiment includes a method of fabricating a metal interconnect structure using ruthenium and a second metal deposition, such as Cu, for example. The metal line can be comprised of Ru and a second metal, such as Cu, fore example. The second metal, such as Cu, can be fully encapsulated in a Ru metal line, and Ru acts as a barrier layer for the second metal, such as Cu. One advantage of techniques herein is that no barrier/liner is needed between Metal-1/Via-1/Metal-2 (M1/V1/M2) interfaces. In other embodiments, a barrier/liner can be useful depending on a selection of the second metal.

In general terms, embodiments described herein provide for a semiconductor device having a plurality of interconnect openings formed within a dielectric material. The interconnect opening can have a trench opening, a via opening, or a dual damascene opening. A first metal can conformally cover a surface of the interconnect opening, and can be in direct contact with the dielectric material. A second metal with a lower resistivity than the first metal can be formed over the first metal and encapsulated by the first metal to form the interconnect structure within the interconnect opening. In the present disclosure, a top surface of the interconnect structure can be lower than a top surface of the dielectric material. The semiconductor device can also have a plurality of conductive layers formed within the dielectric material. The conductive layer can be at a bottom of the interconnect structure and at least one of the conductive layer can be in direct contact with the interconnect structure. As semiconductor devices continue to shrink, meeting conductivity requirement as well as reliability requirement in interconnection structures of the semiconductor devices has become increasingly more difficult. It has been observed that such an interconnect structure disclosed herein may be scaled down for advanced technology node, such as 5 nm node and beyond, while still maintaining low resistivity and good reliability. The first metal can have a property to conformally cover a surface of the interconnect opening to form a void-free lateral interconnections, such as metal lines (wirings), and void-free vertical interconnections, such as conductive vias, to improve the reliability. The second metal having a lower resistivity than the first metal can reduce the resistance of the interconnect structure. In related arts, a barrier/liner layer may be required prior to the deposition of the first metal or the second metal in the interconnect opening. In current disclosure, the first metal or the second metal can be formed without introducing the barrier/liner layer. The first metal can be in direct contact with the dielectric material without introducing a pre-deposited barrier/liner because the first metal has a low metal migration. The first metal can also act as a barrier/liner to the second metal. A fabrication process without the barrier/liner layer disclosed herein can increase the manufacturing throughput, and reduce both the manufacturing cost and the interface resistance between the first metal and the second metal and/or between the first metal and the conductive layer.

Figure 1B:
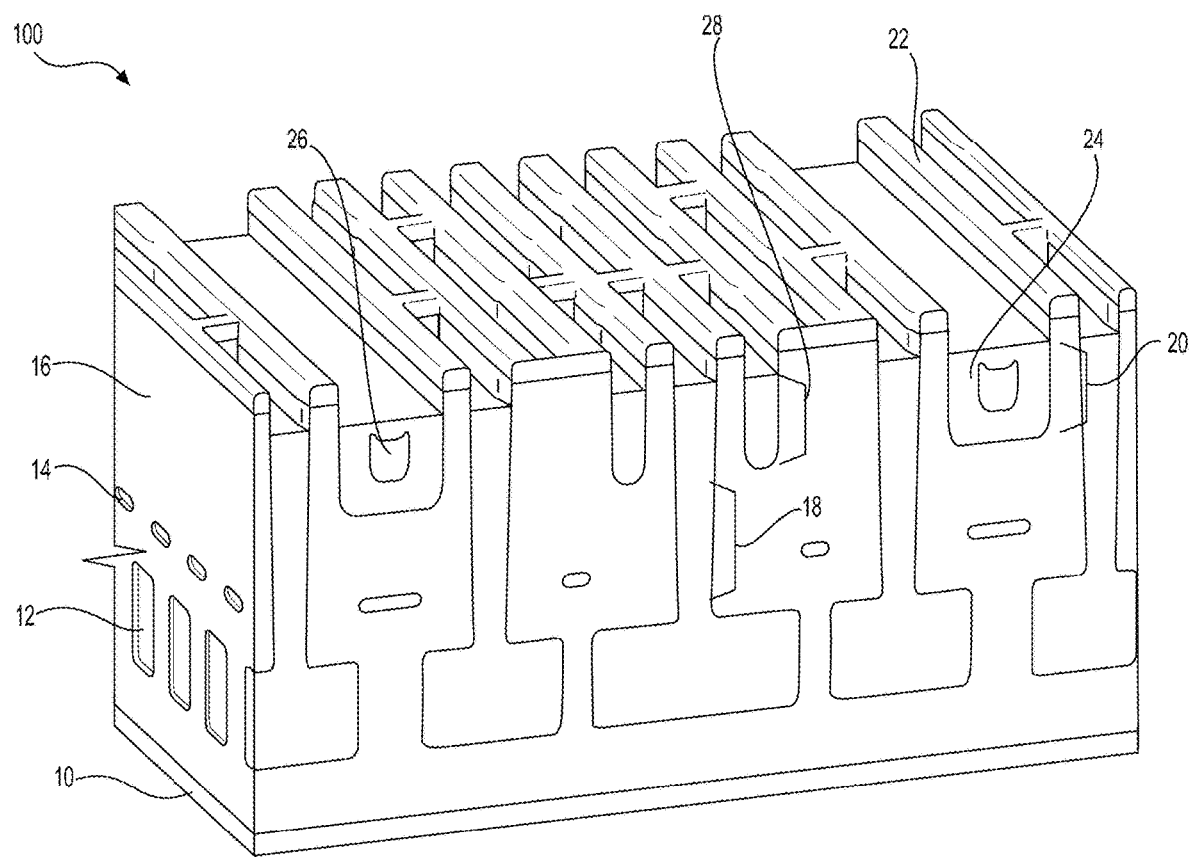
FIG. 1B illustrates a schematic view of an exemplary semiconductor device in accordance with some embodiments.

FIGS. 1A and 1B show a schematic view of a semiconductor device 100, where FIG. 1A represents a perspective view of an exemplary semiconductor device 100 with the dielectric layer 16 removed to view internal structure of the device, while FIG. 1B is a schematic representation of the same semiconductor device 100 showing dielectric layer 16. The semiconductor 100 includes dielectric material that can include a dielectric layer 10, a dielectric layer 14, a dielectric layer 16, and a dielectric layer 22. The dielectric layers 10, 14, and 22 can act as a passivation layer or an etching/polishing stop layer. In some embodiments, the dielectric layers 10, 14, and 22 may be SiN, SiCN, SiC, $AlO_x$, SiON or the like, or the combination, with a thickness, for example, in a range from 20 Å to 300 Å. In some embodiments, the dielectric layer 16 can be an inter-layer dielectric (ILD), an inter-metallization dielectric (IMD) layer, a low-K material layer, or the like, or a combination thereof. The thickness of the dielectric layer 16 varies with the applied technology and can range, for example, from 1000 Å to about 30000 Å. In embodiment of FIGS. 1A and 1B, the dielectric layers 10, 14 and 22 are SiCN and the dielectric layer 16 is an ultra low-k material such as a material containing SiCOH.

The semiconductor device can further include a plurality of conductive layers 12 formed within the dielectric material. In an embodiment, the conductive layer 12 can be a metallization layer in backend of line (BEOL), such as ruthenium (Ru) or copper (Cu), for example. In another embodiment, the conductive layer 12 can be a conductive layer formed on a gate electrode or can be a conductive layer formed on a doped substrate region (e.g., a drain or source region). In various embodiments, the conductive layer 12 can also be any conductive component in the semiconductor device. In the embodiment shown in FIGS. 1A and 1B, the conductive materials 12 is a Ru Metal-1 line.

The dielectric material in the present disclosure can include any number of layers and, as described above, the dielectric material can be patterned to form a plurality of interconnect openings. Shown in FIGS. 1A and 1B, the interconnect opening can be a dual damascene opening and can include a trench opening, such as 20 or 28, and/or a via opening, such as 18. It should be noted that the trench opening can have varying feature sizes, for example, the feature size of trench 20 being bigger than the feature size of trench 28.

The semiconductor device 100 can further include a first metal 24 and a second metal 26. Shown in FIGS. 1A and 1B, the first metal 24 can be conformally deposited in the trench opening, such as 20 and 28, and/or via opening, such as 18, of the interconnect opening. The first metal 24 can be in direct contact with the dielectric material without introduction a pre-deposited barrier/liner because the first metal can have a low metal migration. Still referring to FIGS. 1A and 1B, via opening 18 and trench opening 28 can be fully filled by the first metal 24. While in trench opening 20 that has a bigger feature size than trench opening 28, the first metal 24 can cover bottom and sidewalls of the trench opening 20, and the second metal 26 can be formed over the first metal 24 and encapsulated by the first metal 24. The first metal 24 can act as a barrier/liner to the second metal 26. The first metal 24 and the second metal 26 filled in the interconnect opening together form an interconnect structure where metal filled in the trench opening form a metal line of the interconnect structure to provide lateral interconnection, and metal filled in the via opening form a conductive via of the interconnect to provide vertical interconnection. In the embodiment shown FIGS. 1A and 1B, metal filled in via opening 18 forms an Via-1 structure and metal filled in trench openings 20 and 28 forms Metal-2 lines.

Illustrated in FIGS. 1A and 1B, the conductive layer 12 can be at the bottom of the interconnect structure and be in direct contact with the interconnect structure through the metal in via opening 18. The first metal 24 can have a property to conformally cover a high aspect ratio feature, such as via 18 or trench 28. As mentioned above, an aspect ratio means the ratio of a width to a height of a trench opening, or the ratio of a width to a height of a via opening in the interconnect opening. In various embodiments, the first metal can be ruthenium (Ru), copper (Cu), tungsten (W), aluminum (Al), or cobalt (Co). In the embodiment shown FIGS. 1A and 1B, the first metal 24 is Ru to provide a conformal coverage in a trench opening or a via opening with a high aspect ratio. The second metal 26 can have a lower resistivity than the first metal 24 to reduce the resistance of the interconnect structure, and the first metal 24 acts as a barrier/liner to the second metal 26. In the embodiment shown FIGS. 1A and 1B, the second metal 26 is Cu. In some embodiments, the second metal 26 can also include Cu, copper magnesium (CuMn), Al, W and Co. The semiconductor device 100 can further have a top surface of the interconnect structure (e.g., a top surface of the metal 24) being lower than a top surface of the dielectric material (e.g., a top surface of the dielectric layer 22).

As dimensions of semiconductor devices scales to smaller sub-micron sizes in advanced technology nodes, such as 5 nm node and beyond, it becomes an increasing challenge to reduce the interconnect structure resistance while decreasing the interconnect structure size. The reduced feature size of the interconnect structure also brings challenges in reliability, such as electromigration (EM) and stress migration (SM) due to difficulty to form void-free interconnect structures. In the disclosed semiconductor device 100, the first metal 24 can be conformally deposited into the via 18, the trench 20 and the trench 28 to form a void-free metallization layer, and the second metal 26 with a lower resistivity than the first metal 24 can be formed over the first metal 24 and encapsulated by the first metal 24 to reduce the resistance of the interconnect structure. Moreover, in present disclosure, the first metal can be formed without introducing a barrier/liner layer between the first metal and the surrounding dielectric material due to low metal migration of the first metal. The second metal can be introduced without a barrier/line between the first metal and the second metal because the first metal can act as a barrier/liner to the second metal. A fabrication process without the barrier/liner layer disclosed herein can increase the manufacturing throughput, and reduce both the manufacturing cost and the interface resistance between the first metal and the second metal and/or between the first metal and the conductive layer.

In FIGS. 2 through 13, an exemplary technique of manufacturing the semiconductor device 100 will be described with reference to exemplary schematic views of the semiconductor device at intermediary steps of manufacturing. Beginning with FIG. 2, dielectric material can be formed. The dielectric material can include a dielectric layer 10, a dielectric layer 14, a dielectric layer 16, and a dielectric layer 22. The dielectric layers 10, 14, and 22 can function as a passivation layer or an etching/polishing stop layer. In some embodiments, the dielectric layers 10, 14, and 22 may be SiN, SiCN, SiC, $AlO_x$, SiON or the like, or the combination, with a thickness, for example, in a range between 20 Å to 300 Å. For simplicity and clarity, in the present embodiment, dielectric layers 10, 14, and 22 is SiCN. The dielectric layers 10, 14, and 22 can be deposited through any of a variety techniques, such as chemical vapor deposition (CVD), physical vapor deposition (PVD), atomic layer deposition (ALD), e-beam evaporation, and the like. Over the dielectric layer 10, another dielectric layer 16 can be deposited. In various embodiments, dielectric layer 16 may be a first inter-layer dielectric (ILD) or an inter-metallization dielectric (IMD) layer. The dielectric layer 16 may be formed, for example, of a low-k dielectric material having a k value less than about 4.0 or even about 2.8. The dielectric layer 16 may be phosphosilicate glass (PSG), borophosphosilicate glass (BPSG), FSG (SiOF series material), SiOxCy, Spin-On-Glass, Spin-On-Polymers, silicon carbon material, compounds thereof, and the like. The dielectric layer 16 can deposited through by any suitable method, such as atomic layer deposition (ALD), physical vapor deposition (PVD), liquid source misted chemical deposition (LSMCD), spinning, chemical vapor deposition (CVD), coating or any other process that is adapted to form a thin film layer over the substrate. The thickness of the dielectric layer 16 varies with the applied technology and can range, for example, from 1000 Å to about 30000 Å. For simplicity and clarity, the dielectric layer 16 disclosed herein is an ultra low-k dielectric material containing SiCOH. It should be understood that the dielectric material can include any number of layers, such as isolation layers, glue layers, buffer layers, and the like, depending on the technology requirements.

Figure 2:
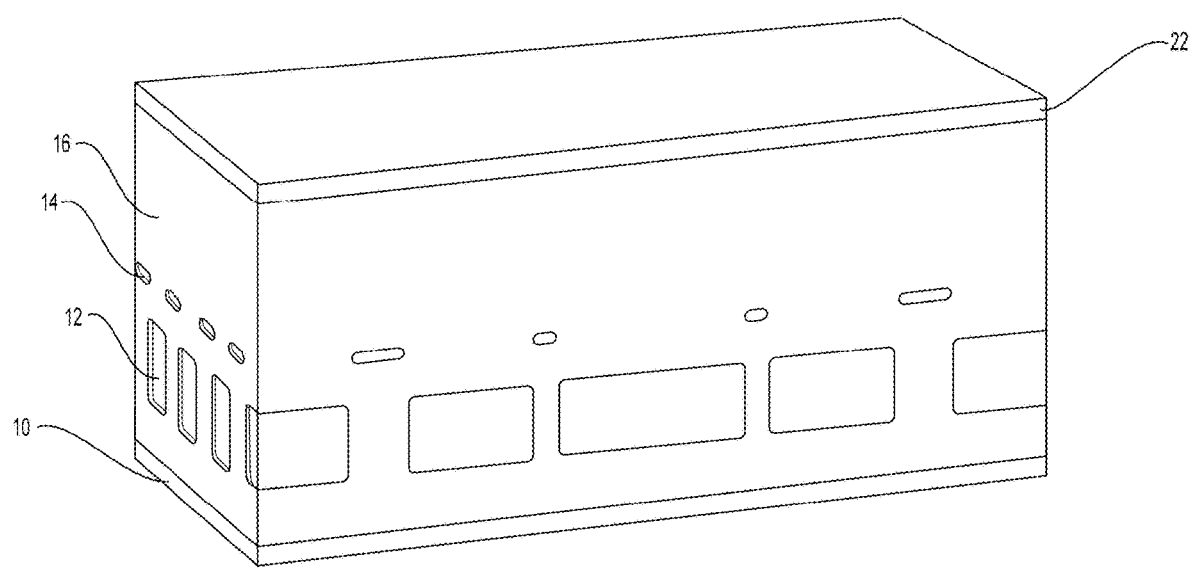
FIGS. 2 through 13 illustrate exemplary schematic views of various intermediary steps of manufacturing a semiconductor device, in accordance with some embodiments.

Still referring to FIG. 2, the dielectric material can further include a plurality of conductive layers 12 formed within the dielectric material. In an embodiment, the conductive layer 12 can be a metallization layer in backend of line (BEOL), such as ruthenium (Ru) or copper (Cu), for example. In another embodiment, the conductive layer 12 can be a conductive layer formed on a gate electrode or can be a conductive layer formed on a doped substrate region (e.g., a drain or source region). In various embodiments, the conductive layer 12 can also be any conductive component in the semiconductor device. In the embodiment of FIG. 2, the conductive layer 12 is a Ru Metal-1 line applied in BEOL. The Ru can be deposited by any suitable method, such as an atomic layer deposition (ALD) process that can be performed in a temperature between 275° C. and 400° C. using bis(cyclopentadienyl)ruthenium ($RuCp_2$) and oxygen as precursors, or a thermal chemical vapor deposition (TCVD) process which can apply a process gas containing $Ru_3(CO)_{12}$ precursor vapor and a CO gas. In the embodiment of FIG. 2, the Ru is deposited through a ALD process.

Figure 3:
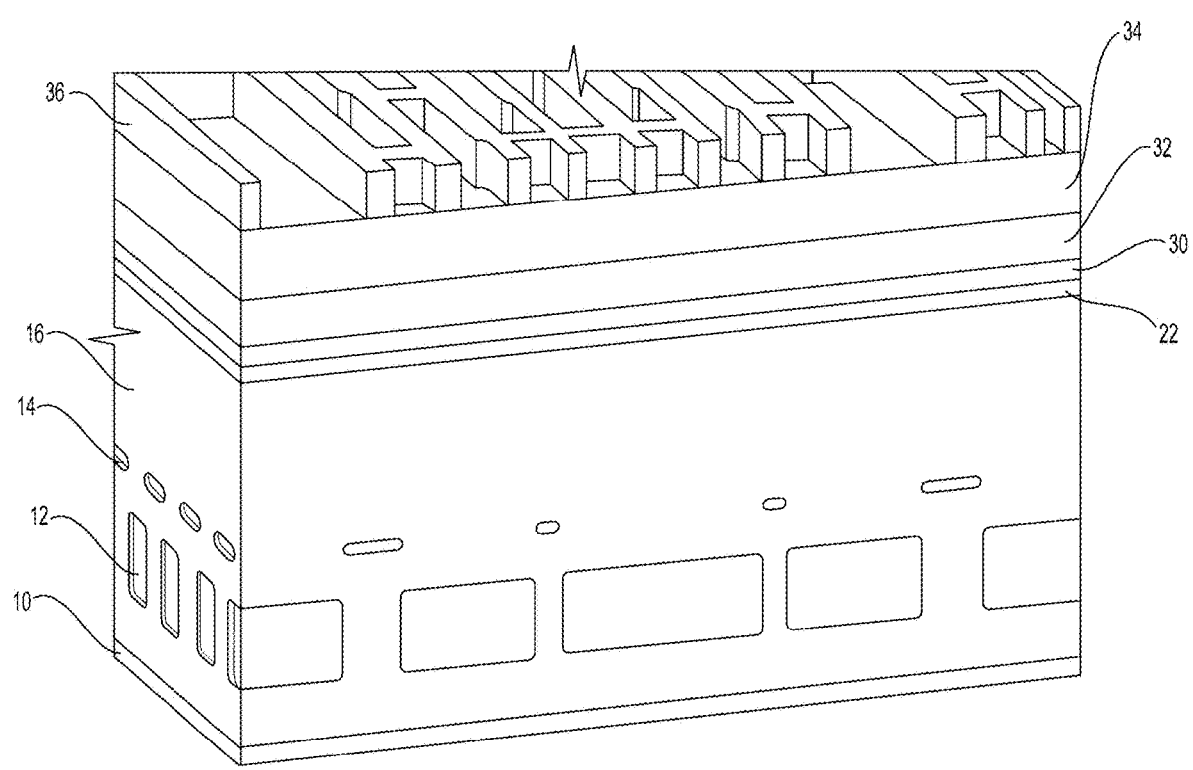

As shown in FIG. 3, a hard mask stack can be formed over the dielectric material. In the embodiment shown, the hard mask stack includes a SiOx layer 30, a TiN layer 32, another SiOx layer 34, and a photoresist layer 36, but other materials may be used. The SiOx layer 30 can have a thickness in a range from about 100 Å to about 200 Å. The TiN layer 32 can have a thickness between 200 Å and 400 Å. The SiOx layer 34 can have a thickness of about 300 Å to about 500 Å, according to technology requirements. SiOx and TiN layers disclosed herein can be deposited by a suitable deposition process, such as chemical vapor deposition (CVD), physical vapor deposition (PVD), atomic layer deposition (ALD), e-beam evaporation, or any combination thereof. The photoresist layer 36 can be patterned according to any suitable technique, such as a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), and the like. In some embodiments, the photoresist 36 can be a layer of photosensitive polymer used to transfer pattern from mask (not shown herein) to underlying substrate. In some embodiments, the photoresist layer 36 could include multiple layers, such as underlayer, hardmask, bottom anti-reflective coatings (BARC), and other suitable materials according to the technology requirement.

Figure 4:
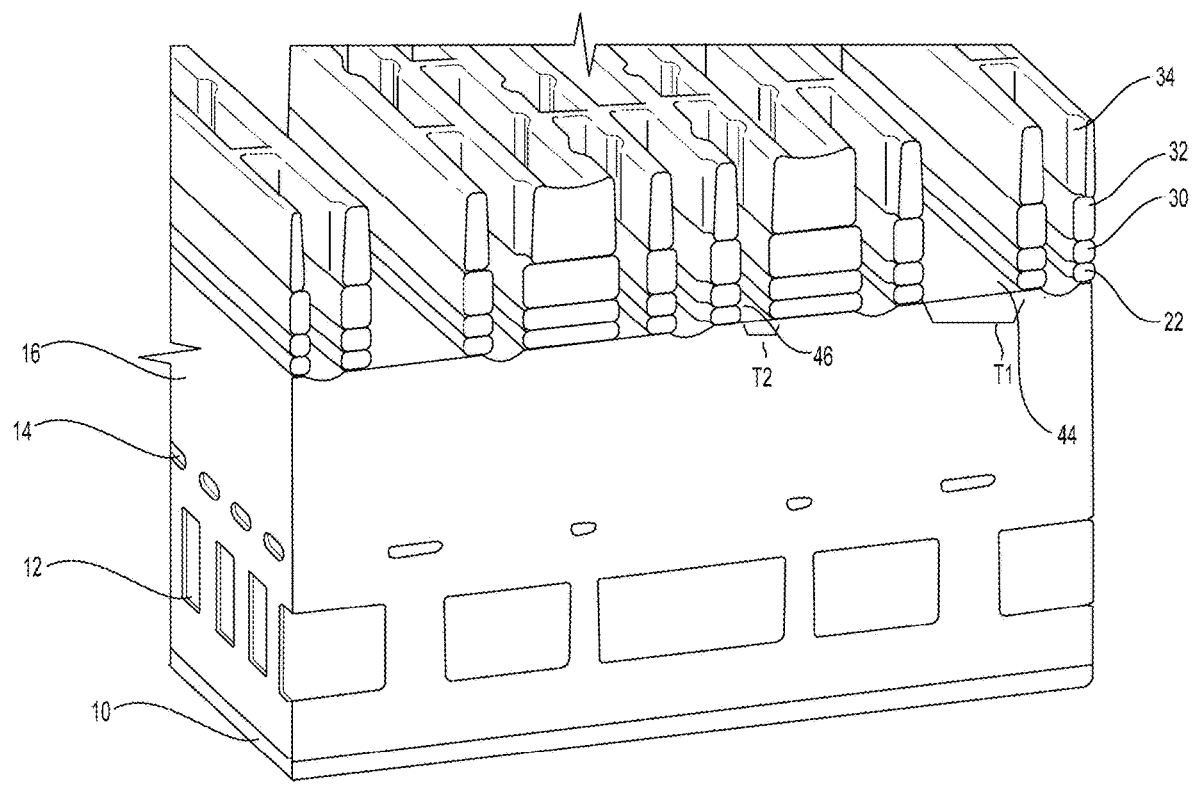

In FIG. 4, a first etching process can be performed to etch the hard mask stack to form a hard mask pattern by using the patterned photoresist layer 36 as a mask. Through the first etching process, a portion of the hard mask stack (includes layers 30, 32, and 34) that is exposed under a dry etching plasma or a wet etching chemical can be removed, and a portion of the hard mask stack that is protected by the photoresist 36 can remain. It should be noted that the first etching process can selectively etch down through the dielectric layer 22 and stop at the dielectric layer 16. Upon completion of the first etching, the remaining photoresist 36 can be removed by, for example, a plasma ashing and/or wet clean processes, and the pattern generated in the photoresist layer 36 can be transferred into the hard mask stack (includes layers 30, 32, and 34) as well as the dielectric layer 22 to form a hard mask pattern having trenches with varying size. The formed hard mask pattern can be used to form a trench opening of the interconnect opening in the subsequent manufacturing steps. Illustrated in FIG. 4, trenches with varying feature sizes can be identified by a critical dimension (CD). For example, trench 44 can have a CD of T1, and trench 46 can have a CD of T2 where T1 is bigger than T2. It should be noted that any suitable technique can be used to etch the dielectric material and the dielectric layer 22. For example, in some embodiments the etching process may include dry etching (e.g., RIE or ICP etching), wet etching, and/or other etching methods.

Figure 5:
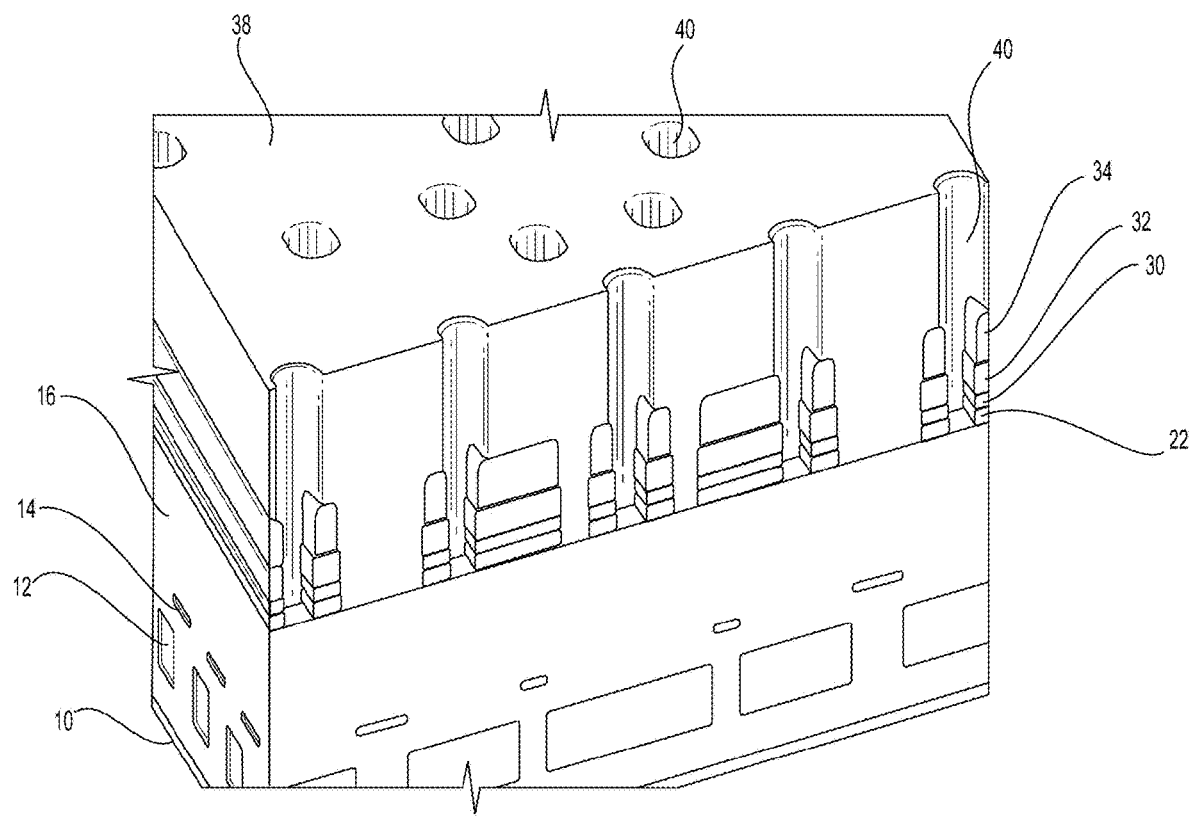

In FIG. 5, another mask layer, such as a spin on carbon (SOC) layer 38 can be coated and patterned over the formed hard mask pattern. SOC is an organic polymer solution, which can be spin coated and baked at high temperature, such as 350° C., to form carbon hard mask comparable to an amorphous carbon film produced by a chemical vapor deposition (CVD) process. Compared to the conventional CVD process, a spin-on process provides lower cost of ownership, less defectivity and better alignment accuracy. In addition, SOC can provide good gap filling and planarization performance for severe topography depending on the SOC morphology and viscosity. The SOC layer 38 can be patterned according to any suitable technique, such as a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), and the like. Shown in FIG. 5, the patterned SOC layer includes a plurality of contact holes 40 which can be used to form the via opening of the interconnect structure in the followed manufacturing steps.

Figure 6:
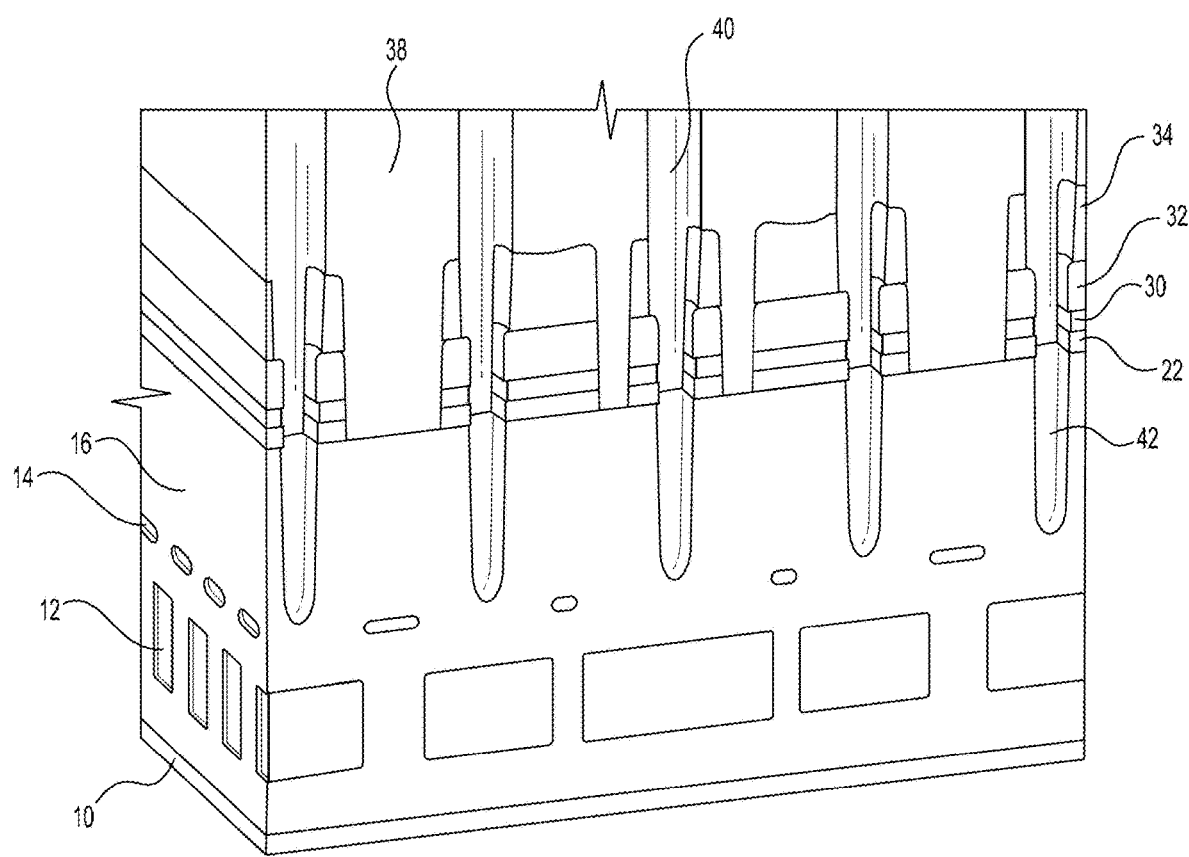

FIG. 6 illustrates a second etching process to etch down (e.g., toward the dielectric layer 10) into the dielectric layer 16 by using the patterned SOC layer as a mask. After the completion of the second etching, the pattern (e.g., contact hole 40) generated in the SOC mask layer can be transferred into the dielectric layer 16 to generate a plurality of contact holes 42. The contact hole 42 can further be extended to land onto the conductive layer 12 in the subsequent manufacturing step to become a complete via opening of the interconnect structure. Any suitable technique can be used to etch the dielectric layer 16 shown in FIG. 6. For example, in some embodiments the etching process may include dry etching (e.g., RIE or ICP etching), wet etching, and/or other etching methods.

Figure 7:
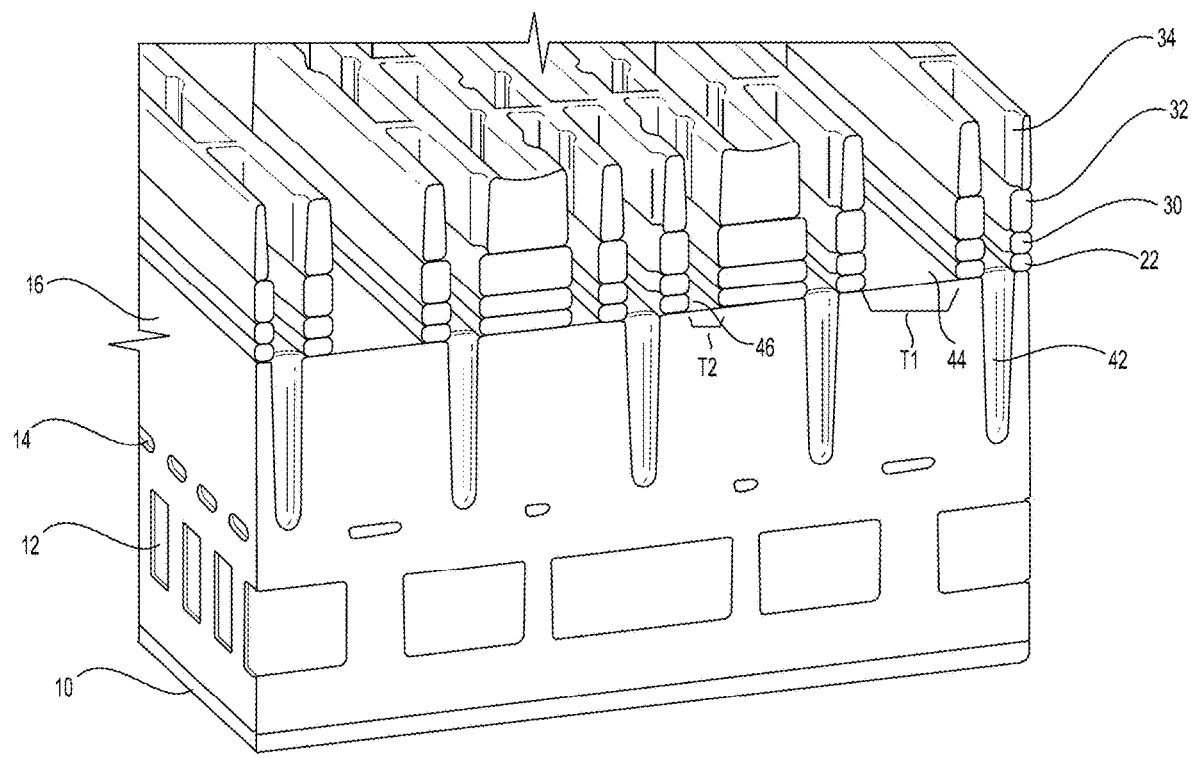

Shown in FIG. 7, a subsequent plasma ashing and/or wet clean processes can be performed to remove the remaining SOC layer after the second etching process. The removal of the remaining SOC layer wouldn't change the patterns that are formed during the second etching process. Shown in FIG. 7, a plurality of trenches with varying feature sizes as well as a plurality of contact holes 42 remain in the dielectric material.

Figure 8:
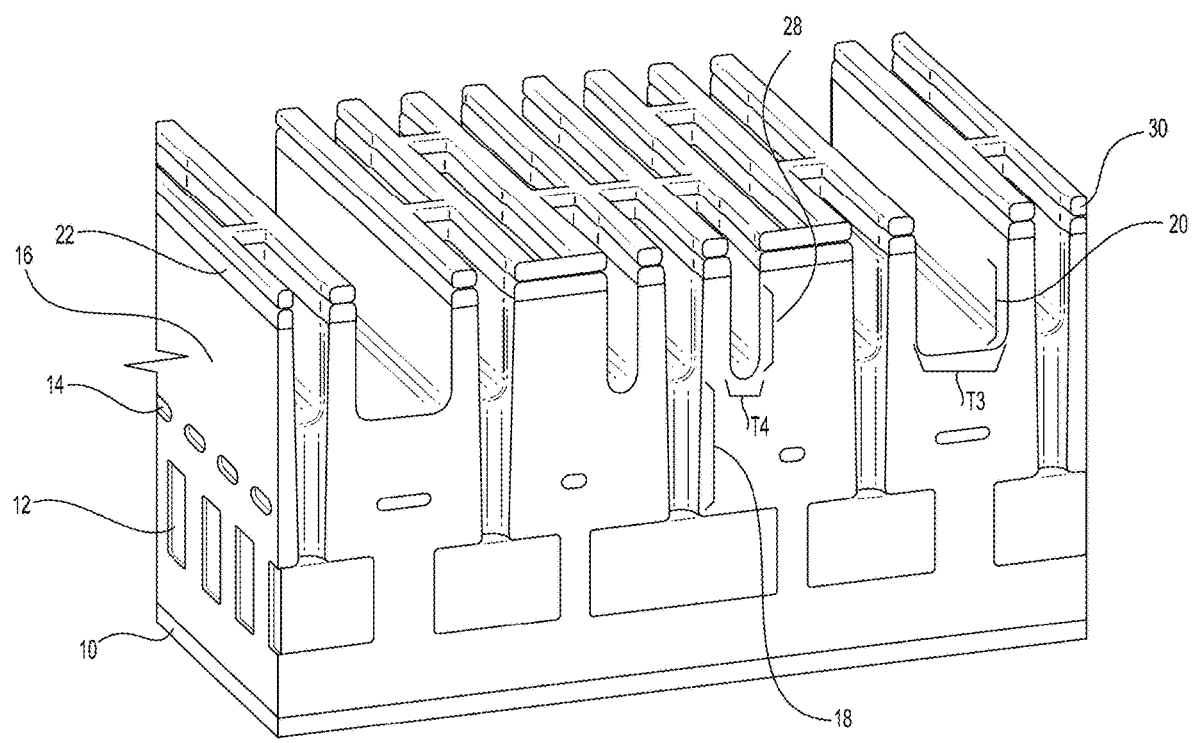

In FIG. 8, a third etching process can be performed by using the patterned hard mask stack as a mask to complete the formation of the interconnect opening having a trench opening, a via opening or a dual damascene opening. During the third etching process, the exposure dielectric layer 16 can be removed partially according to the etching process and a portion of the dielectric layer 16 covered by the hard mask stack (includes layers 30, 32, and 34) can remain. Once the third etching process is completed, the pattern generated shown in FIG. 7 can be transferred into the dielectric layer 16. For example, the trench patterns 44 and 46 formed in FIG. 7 can be transferred into dielectric layer 16 and become the trench openings 20 and 28 correspondingly. It should be noted that during the pattern transferring, the critical dimension (CD) could be changed. For example, the trench pattern 44 has a CD of T1 and the transferred trench opening 20 can have a CD of T3. The T1 can be bigger or smaller than T3 according to the etching process. The contact hole 42 formed in FIG. 7 can be extended down (e.g., toward the dielectric layer 10) further to land onto the conductive layer 12 and become a via opening of the interconnect opening. The via opening formed after the third etching process can be identified as 18, for example. It should be noted that during the third etching process, the hard mask stack can also be etched partially and the dielectric layers 32 and 34 can be consumed fully. After the third etching process, only the dielectric layers 22 and 30 remain. Any suitable technique can be used to etch the dielectric layer 16 shown in FIG. 8. For example, in some embodiments the etching process may include dry etching (e.g., RIE or ICP etching), wet etching, and/or other etching methods.

Figure 9:
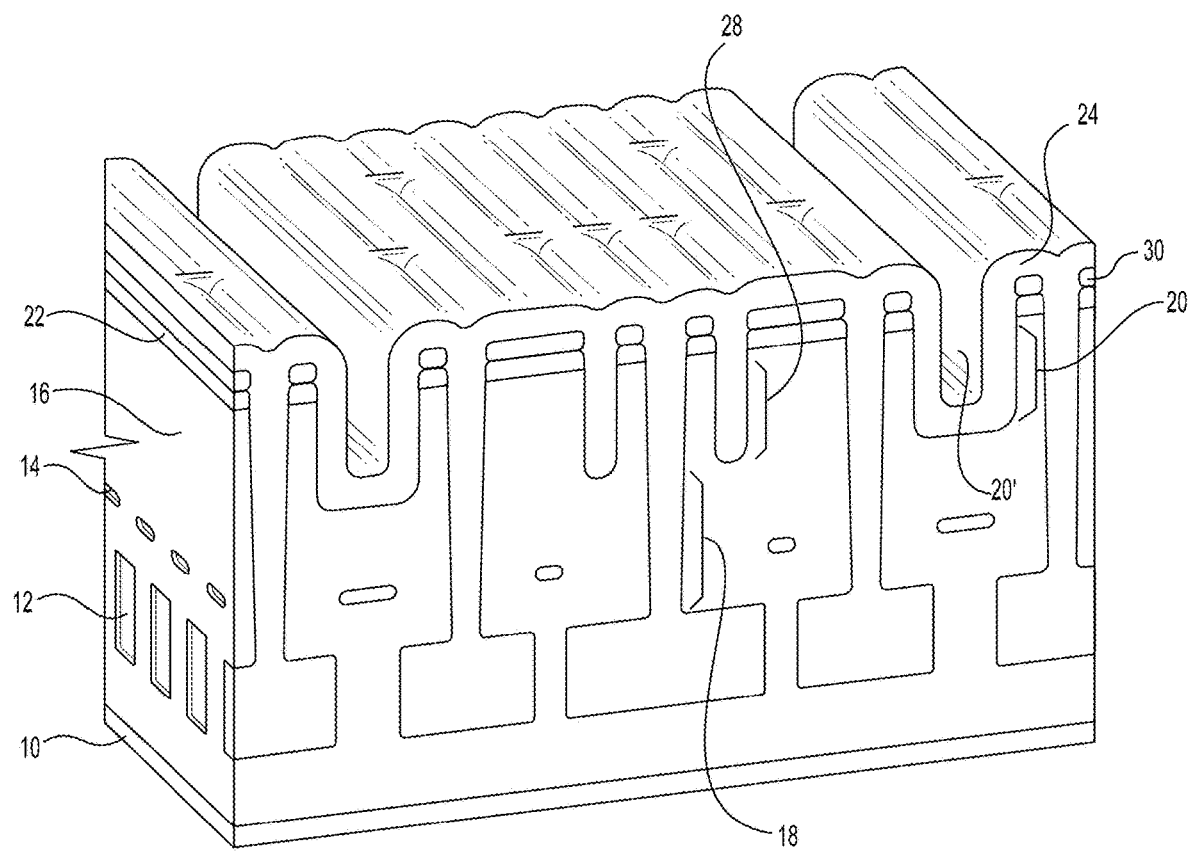

In FIG. 9, a first metal 24 can be deposited to fill in the formed interconnect opening. The first metal 24 can have a property to conformally cover an opening, especially an opening having a high aspect ratio. In various embodiments, the first metal can be ruthenium (Ru), copper (Cu), tungsten (W), aluminum (Al), or cobalt (Co). In the embodiment of FIG. 9, the first metal 24 is Ru to provide a conformal coverage in a trench opening or a via opening with a high aspect ratio. Due to low metal migration, the first metal 24 can be deposited without introducing a barrier/liner between the first metal 24 and the surrounding dielectric material. Shown in FIG. 9, after the deposition of the first metal 24, the via opening 18 shown in FIG. 8 can be fully filled and the metal filled in the via opening 18 can become a conductive via of the interconnect structure to provide vertical interconnection. Regarding the trenching opening, there can be two scenarios. The trench opening having a small feature size, such as trench opening 28 can be fully filled by the first metal. The metal filled in the trench opening 28 becomes metal line of the interconnect structure to provide lateral interconnection. However, the trench opening having a bigger feature size, such as trench opening 20, cannot be fully filled by the first metal 24. Illustrated in FIG. 9, the first metal 24 can conformally cover a bottom and sidewalls of the trench opening 20 and leave a gap 20' in the middle portion of the trench opening 20. Shown in FIG. 9, it should be noted that after the deposition of the first metal 24, a top surface of the dielectric layer 30 can be uniformly covered by the first metal 24 as well. The first metal 24 can be deposited by a suitable deposition process, such as chemical vapor deposition (CVD), physical vapor deposition (PVD), atomic layer deposition (ALD), e-beam evaporation, or any combination thereof. For example, a thermal chemical vapor deposition (TCVD) process which applies a process gas containing $Ru_3(CO)_{12}$ precursor vapor and a CO gas can be used to deposit Ru in the present disclosure. In the embodiment of FIG. 9, the first metal 24 is deposited by an ALD process. The ALD process disclosed herein can reduce metal migration which allows depositing the first metal into the interconnect opening without introduction a pre-deposited barrier/liner. The ALD process can also allow the first metal to conformally cover the interconnect opening.

Figure 10:
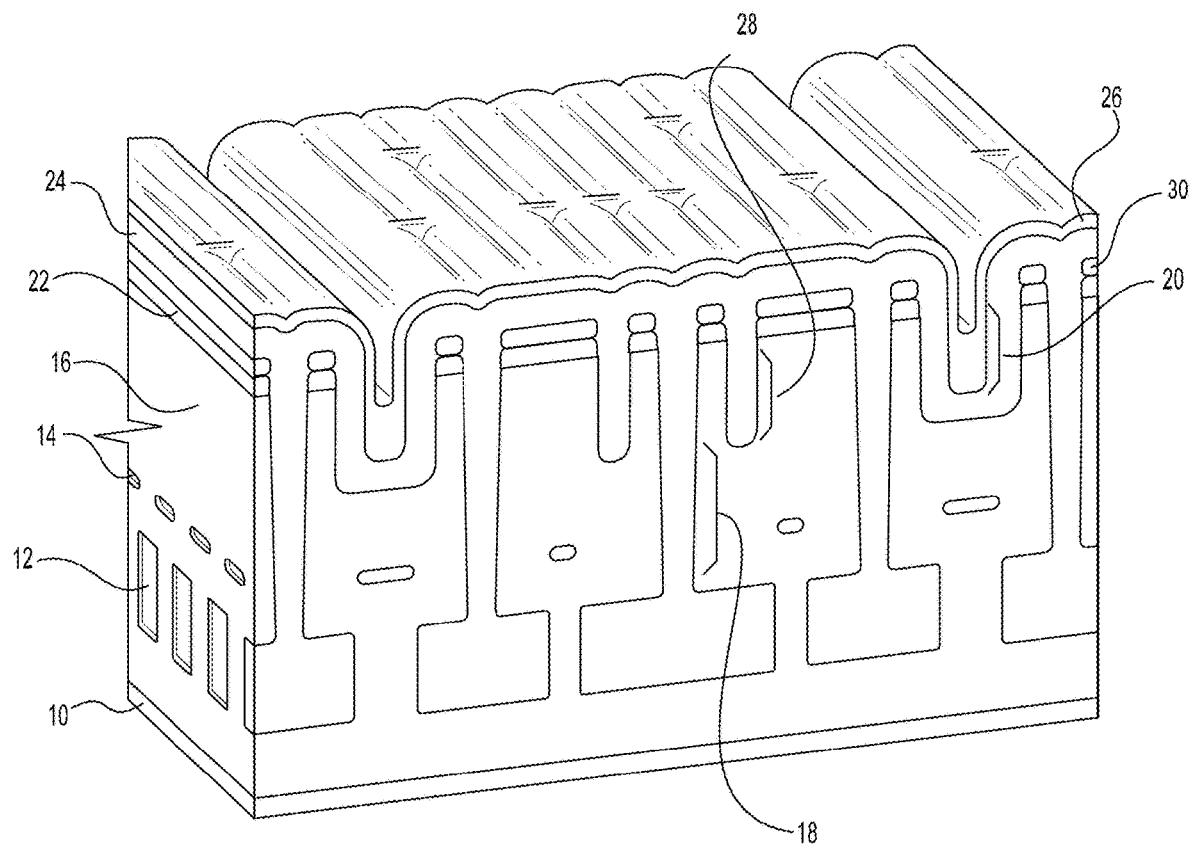

In FIG. 10, a second metal 26 can be deposited directly over the first metal 24 to fill the interconnect opening. As mentioned above, in the current disclosure, the first metal 24 can act as a barrier/liner to the second metal 26. Therefore a barrier/liner is not needed between the first metal 24 and the second metal 26. In some embodiments, the second metal 26 can have a lower resistivity than the first metal 24 to improve the conductivity of the interconnect structure. Shown in FIG. 10, after the formation, the second metal 26 can cover the bottom and sidewalls of the trench opening 20, as well as cover the top surface of the dielectric material. In some embodiments, the second metal 26 can include Cu, copper magnesium (CuMn), Al, W and Co. For simplicity and clarity, the second metal 26 can be Cu in the present disclosure to reduce the resistance of the interconnect structure and can be formed through any suitable deposition process, such as electrochemical plating, chemical vapor deposition (CVD), physical vapor deposition (PVD), atomic layer deposition (ALD), e-beam evaporation, or any combination thereof.

Figure 11:
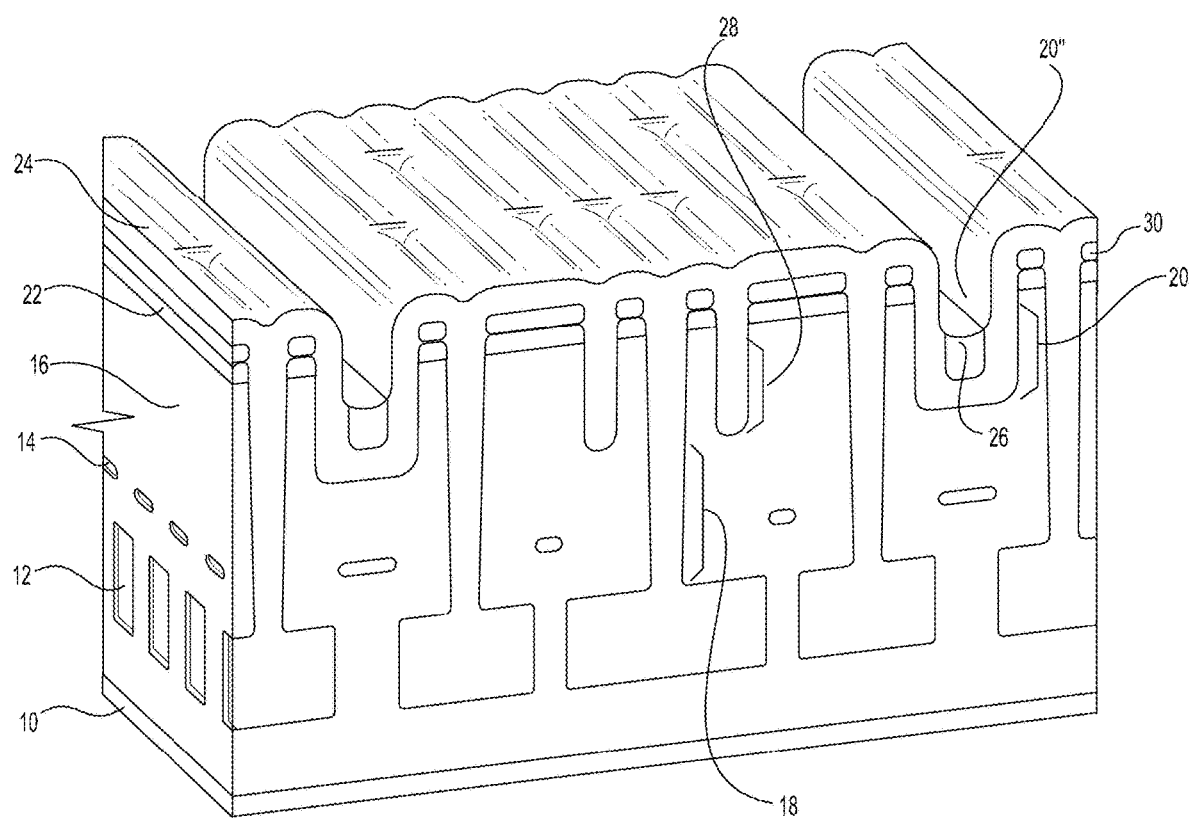

In FIG. 11, a first recessing process can be performed where the second metal 26 can be recessed by a selective dry etching process or a selective wet etching process. A selective etching process means that the etching process mainly etches the second metal 26 and attacks the first metal 24 very lightly. For example, a dry etching process that applies etching gases of $Cl_2$ and $NF_3$ can be used to etch a second metal made of tungsten (W). Shown in FIG. 11, after the recessing process, the portion of the second metal over the top surface of the dielectric material and the portion along the sidewalls of the trench opening, such as trench opening 20, can be removed fully, and the portion over the bottom of the trench opening can be partially removed. After the recessing process, a plurality of gaps, such as gap 20" in trench opening 20, can be formed at the middle portion of the trench opening.

Figure 12:
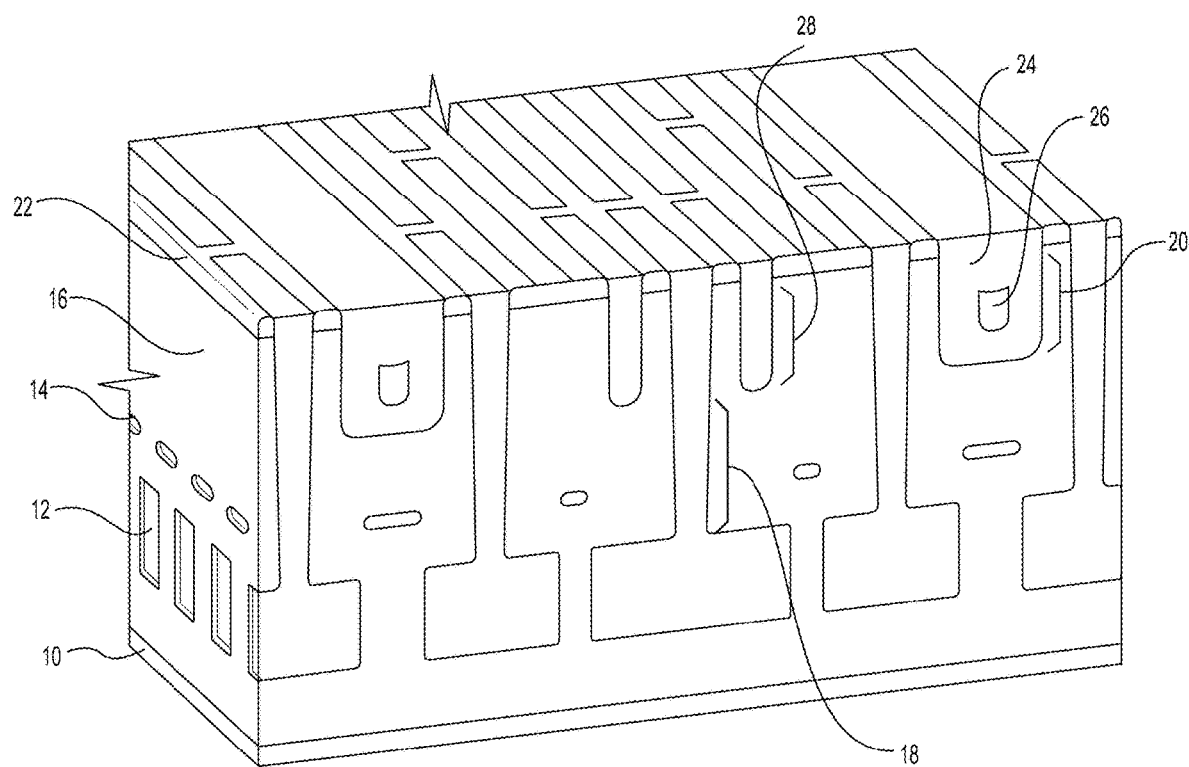

In FIG. 12, a third metal can be deposited over the first metal and the second metal to fill the remaining gaps, such as gap 20" shown in FIG. 11. The third metal over the first metal and the second metal to fill the interconnect opening completely in order to form a metal cap over the interconnect structure to serve as a metalized low-resistivity barrier material to the second metal. This cap would serve the function of a metal barrier to prevent diffusion from the second metal up to the dielectric that can be subsequently deposited above the interconnect structure that will provide insulation between adjacent upper and lower metal layers, and can additionally provide better EM control for the second metal. In some embodiments, the third metal can be different from the first metal or be different from the second metal. In other embodiments, the third metal can be the same as the first metal. In the embodiment of FIG. 12, the third metal is the same as the first metal 24 and can be conformally deposited to fill the remaining gap 20" fully shown in FIG. 11. After the formation of the third metal, the trenching opening 20 in FIG. 11 can be fully filled and the top surface of the dielectric material can be uniformly covered by the third metal. Subsequently, a surface planarization process can be performed to remove any excessive metal over the top surface of the dielectric material. Shown in FIG. 12, the surface planarization process ends at the dielectric layer 22 which can act as a passivation as well as an etching/polishing stop layer. During the surface planarization process, both the dielectric layer 30 and any excessive metal over the top surface of the dielectric material can be removed fully, and a top surface of the dielectric material can be level with a top surface of the metal in the trench opening, such as a top surface of the metal 24 shown in FIG. 12. In some embodiments, a chemical mechanical polishing (CMP) process can be applied to remove any excessive metal over the top surface of the dielectric material. In other embodiments, an etching back process may be applied to remove any excessive metal over the dielectric material.

Figure 13:
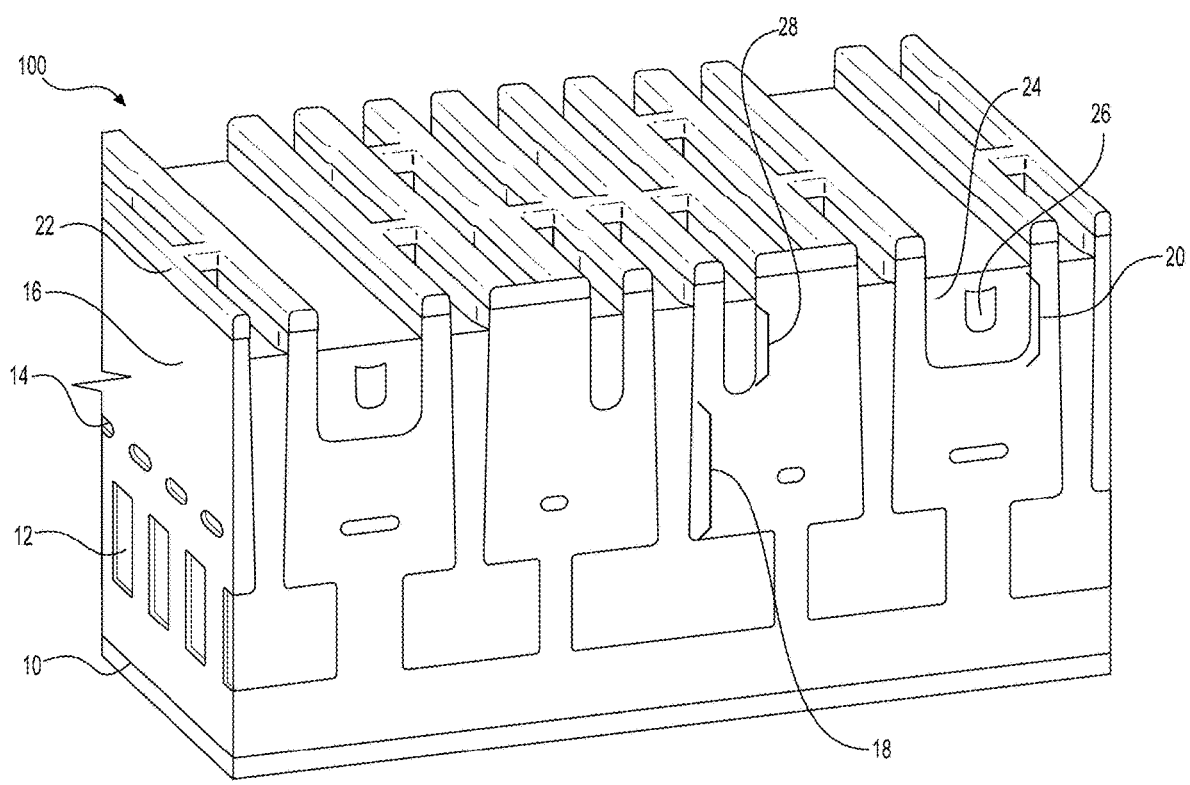

Illustrated in FIG. 13, a second recessing process may be performed to recess a top portion of the third metal after the surface planarization process according to the technology requirement. The recessing process can be performed through a dry etching process or a wet etching process. Shown in FIG. 13, after the metal recessing, a top portion of the metal 24 can be removed and a top surface of the metal 24 can be lower than a top surface of the dielectric material (e.g., a top surface of the dielectric layer 22) correspondingly. In some embodiment, the metal recessing disclosed herein can reduce the parasite capacitance between two metal lines filled in trench openings. In other embodiments, the metal recessing can provide space for the formation of other layers according to technology need. After the metal recessing, a complete semiconductor device 100 can be formed. The semiconductor 100 can include a plurality of interconnect openings formed within a dielectric material. The interconnect opening can have a trench opening, such as trenches 20 and 28, a via opening, such as via 18, or a dual damascene opening. A first metal 24 can conformally cover a surface of the interconnect opening, and can be in direct contact with the dielectric material. A second metal 26 with a lower resistivity than the first metal can be formed over the first metal and be encapsulated by the first metal to form a interconnect structure within the interconnect opening. Metal filled in the trench opening becomes a metal line of the interconnect structure to provide a lateral interconnection, and metal filled in the via opening becomes a conductive via to provide vertical interconnection in the semiconductor device 100. A plurality of conductive layers 12 can be formed within the dielectric material. The conductive layer 12 can be at a bottom of the interconnect structure and can be in direct contact with the interconnect structure through the metal filled in via opening 18.

In related arts, a barrier/liner layer may be required prior to a deposition of a metal to fill in the interconnect opening. In present disclosure, a metal, such as the first metal or the second metal, can be deposited without introducing a barrier/liner because the first metal has a low metal migration and the first metal can act as a barrier/liner to the second metal. A metal deposition without a barrier/liner layer can improve the manufacturing throughput, and reduce the manufacturing cost as well as reduce the interface resistance in the interconnect structure. It should be mentioned that a barrier/liner can also be optionally deposited prior to deposition of the first metal, prior to deposition of the second metal or the third metal, or be deposited on top of the second metal according to the technology requirement. In some embodiments, the barrier/liner can include TiN, Ti, Ta, TaN, MnN, MnSiO, SiN, or the like, or the combination thereof.

Figure 14:
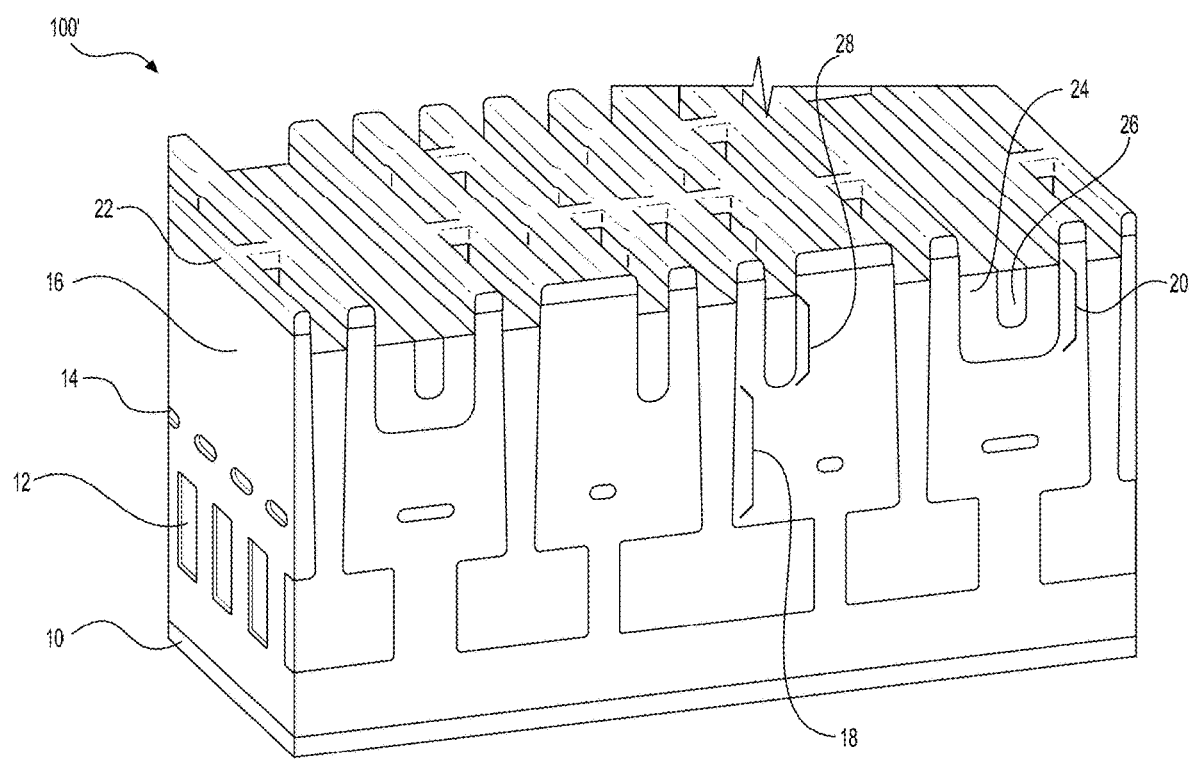
FIG. 14 illustrates an exemplary schematic view of an alternative semiconductor device, in accordance with some embodiments.

Referring now to FIG. 14, an alternative semiconductor device 100' is described. Compared to the semiconductor device 100 illustrated in FIG. 1B, the difference is that in semiconductor device 100' the second metal 26 formed over the first metal 24 can have a top surface being level with a top surface of the first metal 24 rather than the second metal 26 being encapsulated by the first metal 24. In order to form the semiconductor device 100', the second recessing process illustrated in FIG. 13 can be adjusted to expose the top surface of the second metal 26 and makes the top surface of the second metal 26 being level with the top surface of metal 24.

Figure 15:
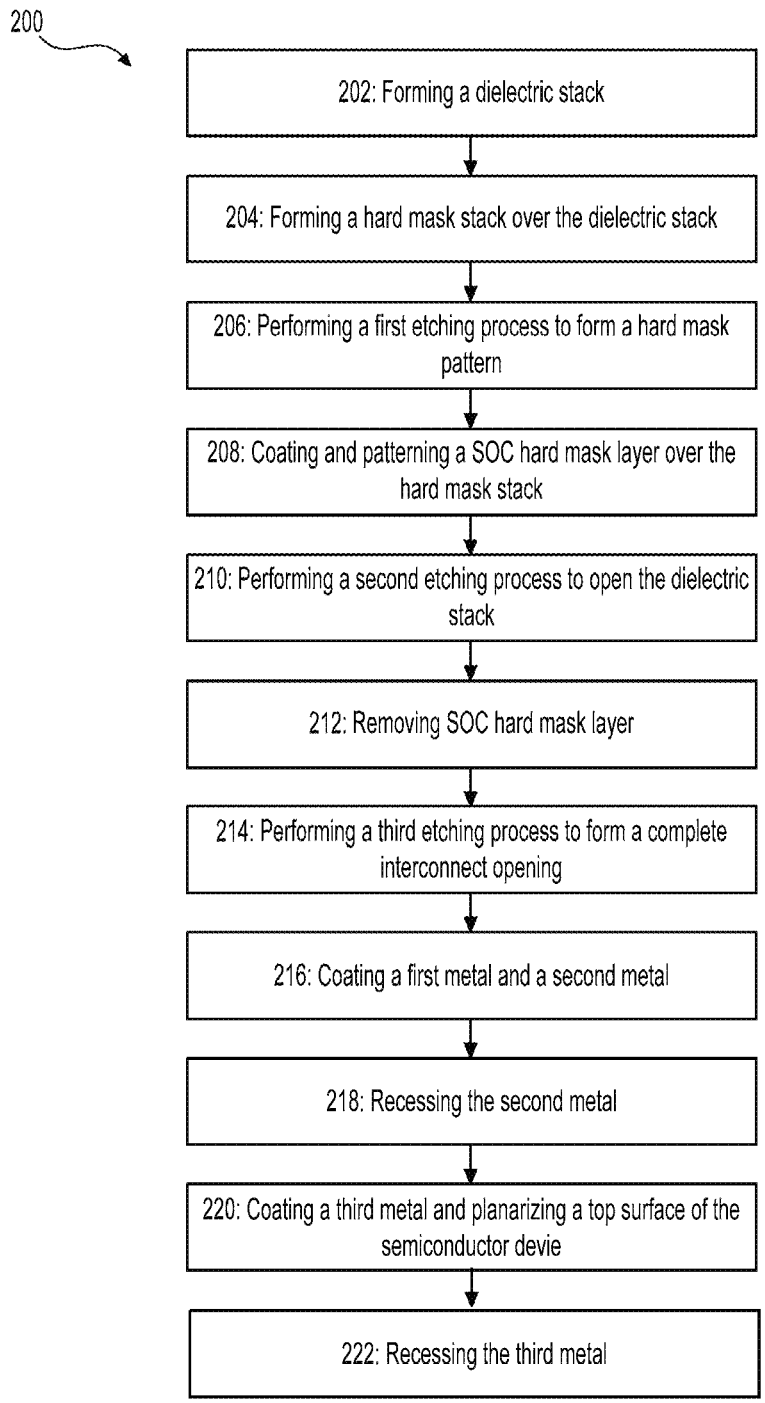
FIG. 15 illustrates an exemplary process flow for manufacturing a semiconductor device, in accordance with some embodiments.

FIG. 15 illustrates an exemplary process flow 200 for forming a semiconductor device 100 in accordance with some embodiments. The process begins in step 202, where dielectric material can be formed. The dielectric material can include a dielectric layer 10, a dielectric layer 14, a dielectric layer 16, and a dielectric layer 22. The dielectric layers 10, 14, and 22 can function as a passivation layer or an etching/polishing stop layer and may be SiN, SiCN, SiC, $AlO_x$, SiON or the like, or the combination. The dielectric layer 16 may be a first inter-layer dielectric (ILD) or an intermetallization dielectric (IMD) layer. The dielectric layer 16 may be formed, for example, of a low-k dielectric material having a k value less than about 4.0 or even about 2.8. For simplicity and clarity, the dielectric layer 16 disclosed herein can be a low-k dielectric material containing SiCOH. The dielectric material can further include a plurality of conductive layers 12 formed within the dielectric material and the conductive layer 12 can be a metallization layer made of Ru in BEOL. The step 202 can be illustrated in FIG. 2.

Next, in step 204, a hard mask stack can be formed over the dielectric material. Shown in FIG. 3, the hard mask stack can include a SiOx layer 30, a TiN layer 32, another SiOx layer 34, and a photoresist layer 36. The photoresist layer 36 can be patterned according to a lithography process.

The process flow 200 can then proceeds to step 206 where a first etching process can be performed to etch the hard mask stack to form a hard mask pattern by using the patterned photoresist layer 36 as a mask. Shown in FIG. 4, through the first etching process, such as a dry etching, a portion of the hard mask stack (includes layers 30, 32, and 34) that is exposed under a dry etching plasma or a wet etching chemical can be removed and a portion of the hard mask stack that is protected by the photoresist 36 can remain. The first etching can further selectively etch down through the dielectric layer 22 and stop at the dielectric layer 16. After completion of the first etching process, a hard mask pattern having trenches with varying size can be formed. The formed hard mask pattern can be used to form a trench opening of the interconnect opening in the followed manufacturing steps.

Subsequently, the process flow 200 proceeds to step 208 where a spin on carbon (SOC) hard mask layer can be coated and patterned over the hard mask stack. The SOC layer 38 can be patterned according to any suitable technique, such as a lithography process. Shown in FIG. 5, the patterned SOC layer include a plurality of contact holes 40 which can be used to form the via opening of the interconnect opening in the followed manufacturing steps.

In step 210, a second etching process can be performed to etch down (e.g., toward the dielectric layer 10) into the dielectric layer 16 by using the patterned SOC layer as a mask. After the second etching is completed, the pattern (e.g., contact holes 40) generated in the SOC mask layer can be transferred into the dielectric layer 16 to generate a plurality of contact holes 42. The contact hole 42 can further be extended to land onto the conductive layer 12 in the future manufacturing step to become a complete via opening of the interconnect opening. The step of 210 can be illustrated in FIG. 6.

The process flow 200 then proceeds to step 212 where a subsequent plasma ashing and/or wet clean processes can be performed to remove the remaining SOC layer after the second etching process. The removal of the remaining SOC layer wouldn't change the patterns that are formed during the second etching process. Shown in FIG. 7, a plurality of trenches with varying feature sizes as well as a plurality of contact holes 42 remain in the dielectric material.

In step 214, a third etching process can be performed by using the patterned hard mask stack as a mask to complete the formation of the interconnect opening having a trench opening, a via opening or a dual damascene opening. The step 214 can be illustrated in FIG. 8. During the third etching process, the exposure dielectric layer 16 can be removed partially according to the etching process and a portion of the dielectric layer 16 covered by the hard mask stack (includes layers 30, 32, and 34) can remain. Once the third etching process is completed, the pattern generated shown in step 210 (shown in FIG. 7) can be transferred into the dielectric layer 16. For example, the trench patterns 44 and 46 formed in step 212 (shown in FIG. 7) can be transferred into dielectric layer 16 and become the trench openings 20 and 28 correspondingly. The contact hole 42 formed in step 212 (shown in FIG. 7) can be extended down (e.g., toward the dielectric layer 10) further to land onto the conductive layer 12 and become a via opening of the interconnect opening.

The process flow 200 then proceeds to step 216 where a first metal 24 can be deposited to fill in the formed interconnect opening. The first metal 24 can have a property to conformally cover an opening, especially an opening having a high aspect ratio. Subsequently, a second metal 26 can be deposited over the first metal 24. Both the first metal and the second metal can be deposited without introducing a barrier/liner because the first metal has a low metal migration and the first metal can act as a barrier/liner to the second metal. In some embodiments, the second metal 26 can have a lower resistivity than the first metal 24 to improve the conductivity of the interconnect structure. The step 216 can be illustrated in FIGS. 9 and 10.

In step 218, a first recessing process can be performed where the second metal 26 can be recessed by a selective dry etching process or a selective wet etching process. Shown in FIG. 11, after the recessing process, the portion of the second metal over the top surface of the dielectric material and the portion along the sidewalls of the trench opening, such as trench opening 20, can be removed fully, and the portion over the bottom of the trench opening can be partially removed.

The process flow 200 then proceeds to step 220 where a third metal can be deposited over the first metal and the second metal to fill the remaining gaps in the trench opening. In the current disclosure, the third metal can be the same as the first metal and can be conformally deposited to fill the trench opening fully. After the formation of the third metal, the trenching opening can be fully filled without any gap and the top surface of the dielectric material can be uniformly covered by the third metal. Subsequently, a surface planarization process can be performed to remove any excessive metal over the top surface of the dielectric material. The step 220 can be illustrated in FIG. 12.

The process flow 200 then proceed to last step 222 where a second recessing process may be performed to recess the top portion of the third metal after the surface planarization process according to the technology requirement. The recessing process can be performed through a dry etching process or a wet etching process. Shown in FIG. 13, after the metal recessing, a top portion of the metal filled in the trench opening can be removed and a top surface of the metal filled in then trench opening can be lower than a top surface of the dielectric material correspondingly. After the second metal recessing, a complete semiconductor device 100 can be formed.

It should be mentioned that the same process flow 200 can be applied to fabricate the alternative semiconductor device 100'. In order to form the semiconductor device 100', the second processing process in last step 222 can be adjusted to expose the top surface of the second metal 26 and makes the top surface of the second metal 26 being level with the top surface of metal 24.

It should be noted that additional steps can be provided before, during, and after the exemplary method 200, and some of the steps described can be replaced, eliminated, or moved around for additional embodiments of the method 200. In subsequent process steps, various additional interconnect structures (e.g., metallization layers having conductive lines and/or vias) may be formed over the dielectric layer 22. Such interconnect structure electrically connect the semiconductor device 100 with other contact structures and/or active devices to form functional circuits. Additional device features such as passivation layers, input/output structures, and the like may also be formed.

Figure 16:
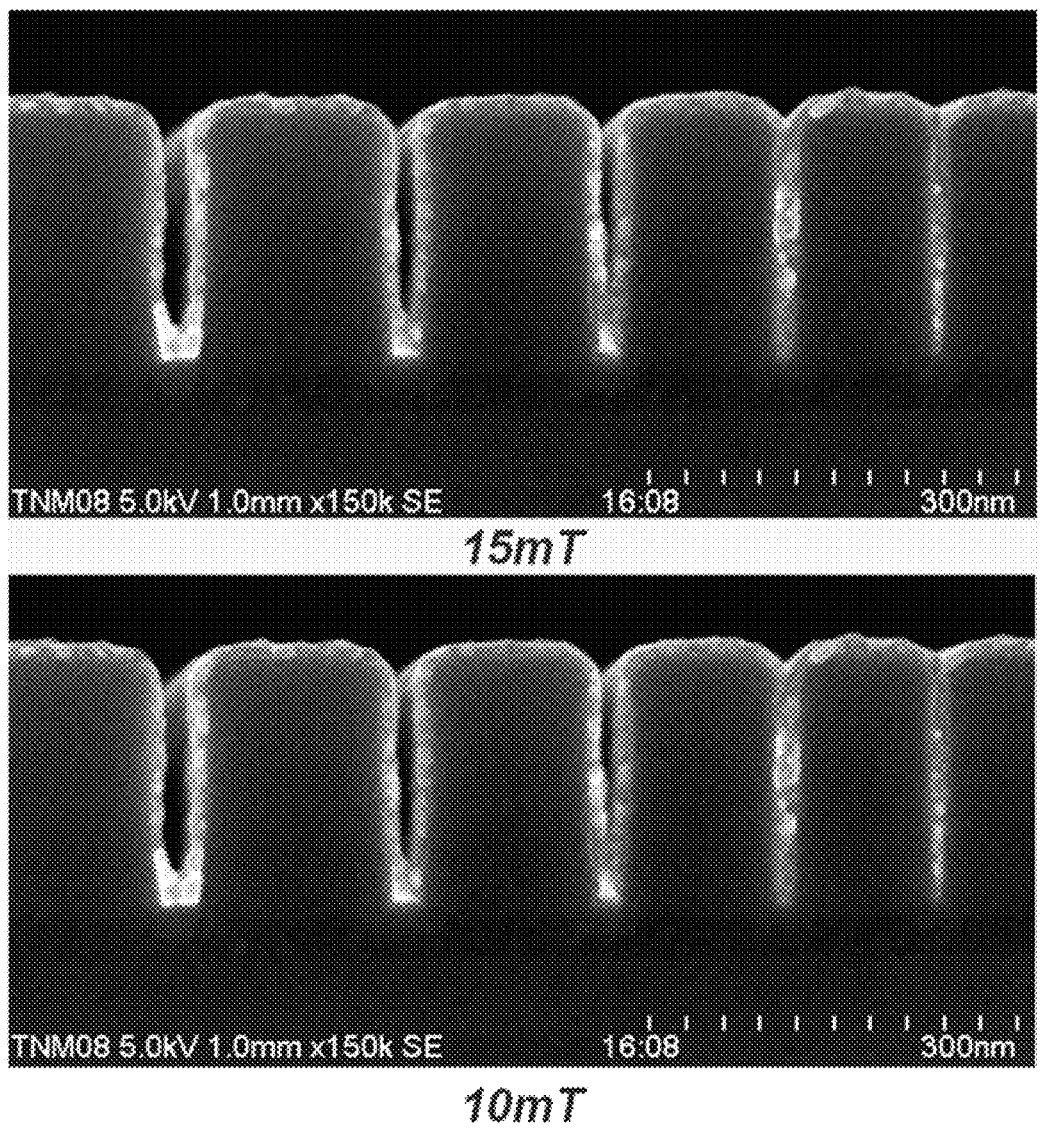
FIG. 16 illustrate a cross-sectional scanning electron microscope (SEM) graph of ruthenium (Ru) deposition by atomic layer deposition (ALD) process or by conformal CVD deposition process.

FIG. 16 illustrates a cross-sectional scanning electron microscope (SEM) graph of ruthenium (Ru) deposition by atomic layer deposition (ALD) process or conformal chemical vapor deposition (CVD) process, according to embodiments in the present disclosure. In FIG. 16, an upper portion shows a formation of Ru through a conformal CVD process operated at a pressure of 15 millitorr and a lower portion shows a Ru formation through a conformal CVD process at a pressure of 10 millitorr. In both conditions, Ru can conformally cover a surface of a trench opening with a big feature size, for example a trench opening located at left end, and can completely fill a trench opening with a small feature size, for example a trench opening located at right end. The similar process can be applied in the present disclosure shown in FIG. 9.

Figure 17:
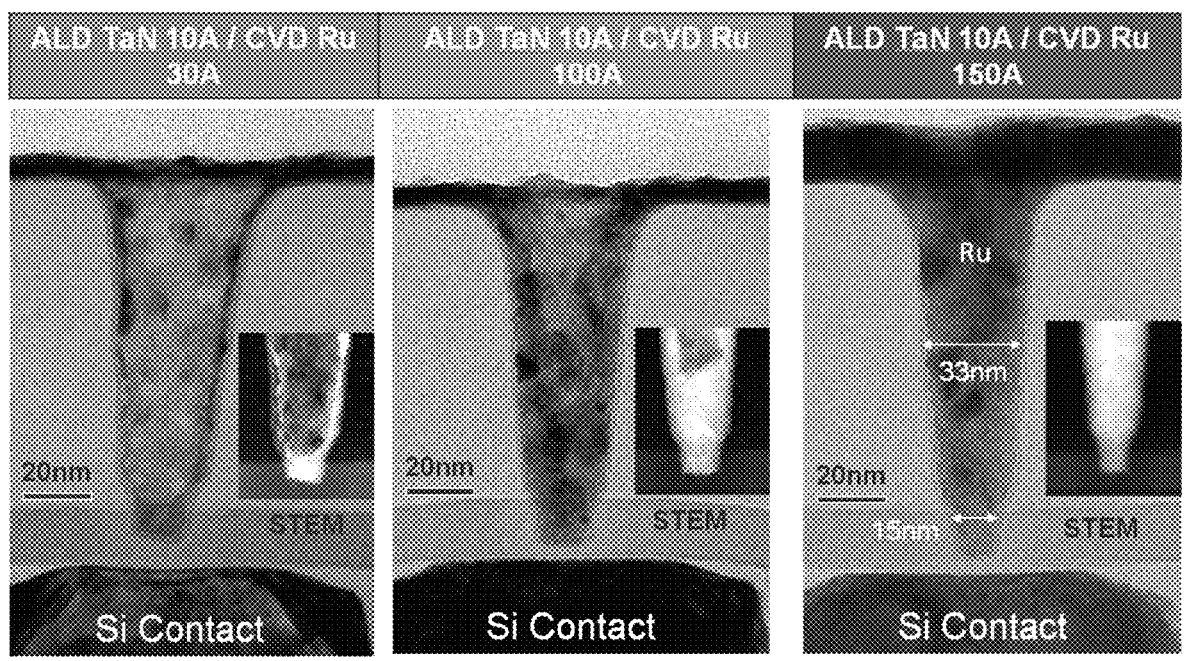
FIG. 17 illustrates cross-sectional scanning transmission electron microscope (STEM) graphs of similar Ru deposition by conformal CVD deposition process.

FIG. 17 illustrates cross-sectional scanning transmission electron microscope (STEM) graphs of similar Ru deposition by conformal CVD process. In FIG. 17, a so called "bottom up" deposition process is illustrated. Shown in graph on left, firstly a 30 Å Ru is deposited into an via opening through a CVD process, and a STEM image shows that the deposited Ru conformally covers sidewalls and bottom of the via opening. Shown in graph in middle, the deposition continues and a 100 Å Ru now is deposited into the via opening. A STEM image shows that most part of the via opening is now filled by Ru. Shown in graph on right, the deposition ends in coating 150 Å Ru into the via opening, and the via opening is fully filled without any void or defect. In addition, the formed Ru covers a top surface of dielectric material within which the via opening is formed. A followed elemental analysis (not shown) through Energy Dispersive X-Ray Spectroscopy (EDX) verifies that the Ru fills the via opening completely without any void or defect. It should be mentioned that, a TaN barrier layer deposited through an ALD process is applied in experiments illustrated in FIG. 17. As mentioned above, a barrier/liner can be skipped or be applied according to technology need.

FIGS. 16 and 17 shows a conformal Ru deposition process through conformal CVD technology which can be utilized in the present disclosure. The Ru deposition process disclosed herein can provide a conformal coverage in an opening feature with a high aspect ratio. The Ru deposition disclosed herein can also reduce the metal migration which allows skipping a barrier/liner during the manufacturing.

With respect to the description provided herein, the present disclosure offers methods and structures for forming a semiconductor device which provides several benefits as the semiconductor devices shrinks to advanced technology node, such as 5 nm node and beyond. The semiconductor device in the present disclosure can meet both the conductivity and reliability requirements in advanced technology nodes. Embodiments of the present disclosure advantageously provide a semiconductor device having a plurality of interconnect openings formed within a dielectric material. In the interconnect structure disclosed herein, a first metal layer can conformally cover the surface of the interconnect opening, and can be in direct contact with the dielectric material due to low metal migration. In addition, the first metal can act as a barrier/liner to the second metal. The second metal layer with a lower resistivity than the first metal can be formed over the first metal directly and encapsulated by the first metal to form an interconnect structure in the interconnect opening. Metal filled in the trench opening can be a metal line of the interconnect structure and metal filled in the via opening can be a conductive via of the interconnect structure. The first metal can have a property to conformally cover an interconnect opening with a high aspect ratio to form a void-free lateral interconnections, such as metal lines (wirings), and void-free vertical interconnections, such as conductive vias, to improve the reliability. The second metal having a lower resistivity than the first metal can reduce the resistivity of the interconnect structure. In related arts, a barrier/liner layer may be required prior to the deposition of the first metal or the second metal in the interconnect structure. In current disclosure, the first metal or the second metal can be formed without introducing the barrier/liner layer. A fabrication process without the barrier/liner layer disclosed herein can improve the manufacturing throughput, and reduce both the manufacturing cost and the interface resistance between the first metal and the second metal and/or between the first metal and the conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, the method comprising:

forming a dielectric material on a substrate;

forming a first interconnect opening and a second interconnect opening within the dielectric material;

depositing a first metal on the first interconnect opening and the second interconnect opening, the first metal filling the first interconnect opening fully to form a first interconnect structure, and conformally covering a surface of the second interconnect opening;

depositing a second metal over the first metal in the second interconnect opening;

recessing the second metal within the second interconnect opening;

depositing the first metal over the second metal to fill the second interconnect opening so as to form a second interconnect structure, the second metal being encapsulated by the first metal in the second interconnect structure; and planarizing the semiconductor device so that a top surface of the dielectric material, a top surface of the first metal in the first interconnect opening and a top surface of the first metal in the second interconnect opening are co-planar, wherein the first metal is made of a first material, and the second metal is made of a second material.

2. The method of claim 1, further comprising, after the planarizing the semiconductor device, recessing the first metal, wherein the top surface of the first metal in the first interconnect opening and the top surface of the first metal in the second interconnect opening are lower than the top surface of the dielectric material.

3. The method of claim 1, wherein forming the dielectric material comprises forming a plurality of conductive layers within the dielectric material.

4. The method of claim 3, wherein forming the conductive layers within the dielectric material comprises forming the conductive layers at a bottom of the first interconnect opening and a bottom of the second interconnect opening, at least one of the conductive layers being in direct contact with the first metal filled in the first interconnect opening or the first metal filled in the second interconnect opening.

5. The method of claim 1, wherein forming the second interconnect opening comprises forming a trench opening and a via opening within the dielectric material.

6. The method of claim 5, wherein forming the second interconnect opening within the dielectric material comprises:
- forming a hard mask stack over the dielectric material;
- performing a first etching process to etch the hard mask stack to pattern the hard mask stack;
- coating a spin on carbon (SOC) layer over the patterned hard mask stack and patterning the SOC layer;
- performing a second etching process to etch down into the dielectric material by using the patterned SOC layer as a mask;
- removing the SOC layer; and
- performing a third etching process to etch down into the dielectric material by using the patterned hard mask stack as a mask to complete the formation of the second interconnect opening having a trench opening and a via opening within the dielectric material.

7. The method of claim 6, wherein depositing the second metal over the first metal in the second interconnect opening comprises forming a second metal layer over the first metal, the second metal layer including a first portion over the top surface of the dielectric material, a second portion over a bottom of the trench opening of the second interconnect opening, and a third portion along sidewalls of the trench opening of the second interconnect opening.

8. The method of claim 7, wherein recessing the second metal comprising fully removing the first portion of the second metal layer over the top surface of the dielectric material and the second portion of the second metal layer along the sidewalls of the trench opening of the second interconnect opening, and partially removing the third portion of the second metal layer over the bottom of the trench opening of the second interconnect opening.

9. The method of claim 1, wherein the first metal comprises at least one of ruthenium (Ru), copper (Cu), tungsten (W), aluminum (Al), or cobalt (Co).

10. The method of claim 1, wherein the second interconnect opening has a bigger feature size as compared to a feature size of the first interconnect opening.

11. The method of claim 1, wherein the second metal has a lower resistivity than a resistivity of the first metal.

* * * * *